United States Patent
Kim et al.

(10) Patent No.: US 8,443,268 B2
(45) Date of Patent: May 14, 2013

(54) METHOD OF PERFORMING INTERLEAVING AND DATA TRANSMISSION APPARATUS

(75) Inventors: So Yeon Kim, Gyeonggi-do (KR); Min Seok Oh, Gyeonggi-do (KP); Seung Hyun Kang, Gyeonggi-do (KR); Ji Ae Seok, Gyeonggi-do (KR); Ji Wook Chung, Gyeonggi-do (KR); Young Seob Lee, Gyeonggi-do (KR); Jae Hoon Chung, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 478 days.

(21) Appl. No.: 12/665,699

(22) PCT Filed: Jun. 20, 2008

(86) PCT No.: PCT/KR2008/003529
§ 371 (c)(1),
(2), (4) Date: Nov. 22, 2010

(87) PCT Pub. No.: WO2008/156335
PCT Pub. Date: Dec. 24, 2008

(65) Prior Publication Data
US 2011/0060970 A1    Mar. 10, 2011

Related U.S. Application Data

(60) Provisional application No. 60/945,104, filed on Jun. 20, 2007.

(30) Foreign Application Priority Data

Feb. 4, 2008  (KR) .................. 10-2008-0011202

(51) Int. Cl.
*H03M 13/00* (2006.01)

(52) U.S. Cl.
USPC ........................................... 714/786

(58) Field of Classification Search .......... 714/781–788, 714/790–794, 796, 798, 821
See application file for complete search history.

(56) References Cited

U.S. PATENT DOCUMENTS 6,910,110 B2 * 6/2005 Kim et al. ...................... 711/157
7,155,642 B2 * 12/2006 Han ............................... 714/701

(Continued)

FOREIGN PATENT DOCUMENTS

| KR | 10-0350459 | 12/2002 |
|----|------------|---------|
| KR | 10-0438448 | 7/2004  |

(Continued)

*Primary Examiner* — Nadeem Iqbal
(74) *Attorney, Agent, or Firm* — Lee, Hong, Degerman, Kang & Waimey

(57) ABSTRACT

A method of performing interleaving and a data transmission apparatus are disclosed, in which interleaving is performed for input data streams using bit reverse ordering (BRO) operation. A method of performing interleaving for input data streams comprises writing respective bits of the input data stream in a row direction of a memory matrix in accordance with the input order, performing row permutation for index of each row of the memory matrix using an R-bit (R is an integer) bit reverse ordering (BRO) operation, performing pruning for a row which satisfies a given condition, performing column permutation using BRO operation for index of each column of the memory matrix, and reading to output each bit in a column direction of the memory matrix where the column permutation has been performed.

14 Claims, 3 Drawing Sheets

U.S. PATENT DOCUMENTS

| | | | |
|---|---|---|---|
| 7,263,637 B2 * | 8/2007 | Ha et al. | 714/701 |
| 2003/0167436 A1 * | 9/2003 | Ha et al. | 714/756 |
| 2004/0170232 A1 * | 9/2004 | Ha et al. | 375/295 |
| 2009/0113274 A1 * | 4/2009 | Lee | 714/776 |
| 2009/0164748 A1 * | 6/2009 | Mansour | 711/202 |

FOREIGN PATENT DOCUMENTS

| | | |
|---|---|---|
| KR | 10-0510643 | 8/2005 |
| KR | 10-0724921 | 6/2007 |
| KR | 10-0860660 | 9/2008 |

* cited by examiner

METHOD OF PERFORMING INTERLEAVING AND DATA TRANSMISSION APPARATUS

CROSS-REFERENCE TO RELATED APPLICATIONS

This application is the National Stage filing under 35 U.S.C. §371 of International Application No. PCT/KR2008/003529, filed on Jun. 20, 2008, which claims the benefit of earlier filing date and right of priority to Korean Application No. 10-2008-0011202, filed on Feb. 4, 2008, and also claims the benefit of U.S. Provisional Application Ser. No. 60/945,104, filed on Jun. 20, 2007.

TECHNICAL FIELD

The present invention relates to a method of performing interleaving, and more particularly, to a method of performing interleaving and a data transmission apparatus, in which interleaving is performed for an input data stream using the bit reverse ordering (BRO) operation.

BACKGROUND ART

A transmitter of a wireless communication system transmits data sequences in the order of a specific pattern by using interleaving without continuously transmitting them in their input order. Burst error frequently occurring on a wireless link can be shifted to random error by interleaving. In other words, in the wireless communication system, it is likely that a part of transmission data may be lost at one time by fading. If continuous data are lost at one time, this error cannot be corrected even if good error correction code is used. On the other hand, if error bits are sparse in sequences of transmission data, the error can be corrected using error correction code such as convolution code, turbo code, and LDPC (Lowe Density Parity Check) code. Accordingly, it is necessary to shift burst error to random error using interleaving.

Since interleaving means that data sequences are written in a memory and then read in the order different from the written order in accordance with a given rule, which is previously defined, it needs to generate a memory write address and a memory read address.

One of methods of generating a read address for interleaving includes a BRO (Bit Reverse Ordering) scheme. The BRO scheme means an operation scheme which shifts a digit of a decimal number to a binary number of M bits, reverses MSB to become LSB, and vice versa, with respect to full M bits, and then shifts the binary number to the decimal number. For example, the order of shifting a digit 3 of a decimal number in accordance with 5-bit BRO operation (M=5) is as follows. If a digit 3 is shifted to a binary number of 5 bits, it becomes '00011.' If the bit order of '00011' undergoes reverse ordering, it becomes '11000.' If '11000' is shifted to a decimal number, it becomes 24. Accordingly, the result of 5-bit BRO operation for a digit 3 of a decimal number becomes 24. As described above, the data sequences are output using the read address order after the write address is shifted to the read address using the BRO operation. In this case, since the order of the data sequences is changed, interleaving can be performed.

Equation 1 generally expresses the result of M-bit BRO interleaving when an interleaving depth, i.e., a size L of index set $(0, 1, 2, \ldots, L-1)$ is $2^M$. In this case, BRO (i, M) represents the result of M-bit BRO operation for a decimal number i.

$$j = \pi(i) = BRO(i,M), i = 0,1,2, \ldots ,L-1$$ [Equation 1]

If the interleaving depth L is greater than $2^{M-1}$ and smaller than $2^M$, M-bit BRO operation is performed for indexes of $0\sim(2^M-1)$, and interleaving is performed for indexes greater than or equal to L by pruning. The following represents an algorithm for performing interleaving through M-bit BRO operation using pruning when L is $2^{M-1}<L<2^M$.

```
i = 0
for m=0 to 2^M−1
 B = BRO(m , M )   // M-bits BRO operation
 if B < L          // only if B is smaller than L,
  π (i) = B        // B is used as the result of BRO interleaving for i
  i= i+1
 end if
end for
```

TABLE 1

| M | B = BRO(m, 5) | i | j = π(i) |
|---|---|---|---|
| 0 | 0 | 0 | 0 |
| 1 | 16 | 1 | 16 |
| 2 | 8 | 2 | 8 |
| 3 | 24 | (pruning) | |
| 4 | 4 | 3 | 4 |
| 5 | 20 | 4 | 20 |
| 6 | 12 | 5 | 12 |
| 7 | 28 | (pruning) | |
| 8 | 2 | 6 | 2 |
| 9 | 18 | 7 | 18 |
| 10 | 10 | 8 | 10 |
| 11 | 26 | (pruning) | |
| 12 | 6 | 9 | 6 |
| 13 | 22 | 10 | 22 |
| 14 | 14 | 11 | 14 |
| 15 | 30 | (pruning) | |
| 16 | 1 | 12 | 1 |
| 17 | 17 | 13 | 17 |
| 18 | 9 | 14 | 9 |
| 19 | 25 | (pruning) | |
| 20 | 5 | 15 | 5 |
| 21 | 21 | 16 | 21 |
| 22 | 13 | 17 | 13 |
| 23 | 29 | (pruning) | |
| 24 | 3 | 18 | 3 |
| 25 | 19 | 19 | 19 |
| 26 | 11 | 20 | 11 |
| 27 | 27 | (pruning) | |
| 28 | 7 | 21 | 7 |
| 29 | 23 | 22 | 23 |
| 30 | 15 | 23 | 15 |
| 31 | 31 | (pruning) | |

Table 1 represents the result of the read address for interleaving using 5-bit BRO operation and pruning when L is equal to 24 (L=24). In case of L=24, since L is $2^4<L<2^5$, 5-bit BRO operation of M=5 is used, and if the result of 5-bit BRO operation is greater than or equal to 24, pruning is performed. In Table 1, interleaving can be performed in such a manner that bits are output in the order of index i.

If L number of result values among result values of BRO operation performed for $2^M$ decimal numbers of $0\sim2^M-1$ are used for interleaving, pruning should be performed for $2^M-L$ number of BRO operation result values. Accordingly, the maximum number of times of pruning of M-bit BRO interleaving for $2^{M-1}<L\leq2^M$ is $2^M-1$, and the number of times of pruning increases if M becomes greater. If the number of times of pruning increases, problems occur in that system performance is deteriorated and additional complexity is caused.

DISCLOSURE OF THE INVENTION

Accordingly, the present invention is directed to a method of performing interleaving and a data transmission apparatus, which substantially obviate one or more problems due to limitations and disadvantages of the related art.

An object of the present invention is to provide a method of performing interleaving and a data transmission apparatus, in which system performance is improved and complexity is reduced.

To achieve these objects and other advantages and in accordance with the purpose of the invention, as embodied and broadly described herein, a method of performing interleaving for input data streams comprises writing respective bits of the input data stream in a row direction of a memory matrix in accordance with the input order, performing row permutation for index of each row of the memory matrix using an R-bit (R is an integer) bit reverse ordering (BRO) operation, performing pruning for a row which satisfies a given condition, performing column permutation using BRO operation for index of each column of the memory matrix, and reading to output each bit in a column direction of the memory matrix where the column permutation has been performed.

In another aspect of the present invention, a data transmission apparatus comprises a channel encoder performing channel encoding for an input data stream, an interleaver performing interleaving for at least part of codeword output from the channel encoder by using row permutation and column permutation using BRO operation, and a buffer storing a data stream output from the interleaver.

According to the present invention, it is possible to reduce the number of times of pruning when interleaving is performed using the BRO operation. As a result, it is possible to improve system performance and reduce complexity.

BEST MODE FOR CARRYING OUT THE INVENTION

Hereinafter, structures, operations, and other features of the present invention will be understood readily by the preferred embodiments of the present invention, examples of which are illustrated in the accompanying drawings.

Figure 1:
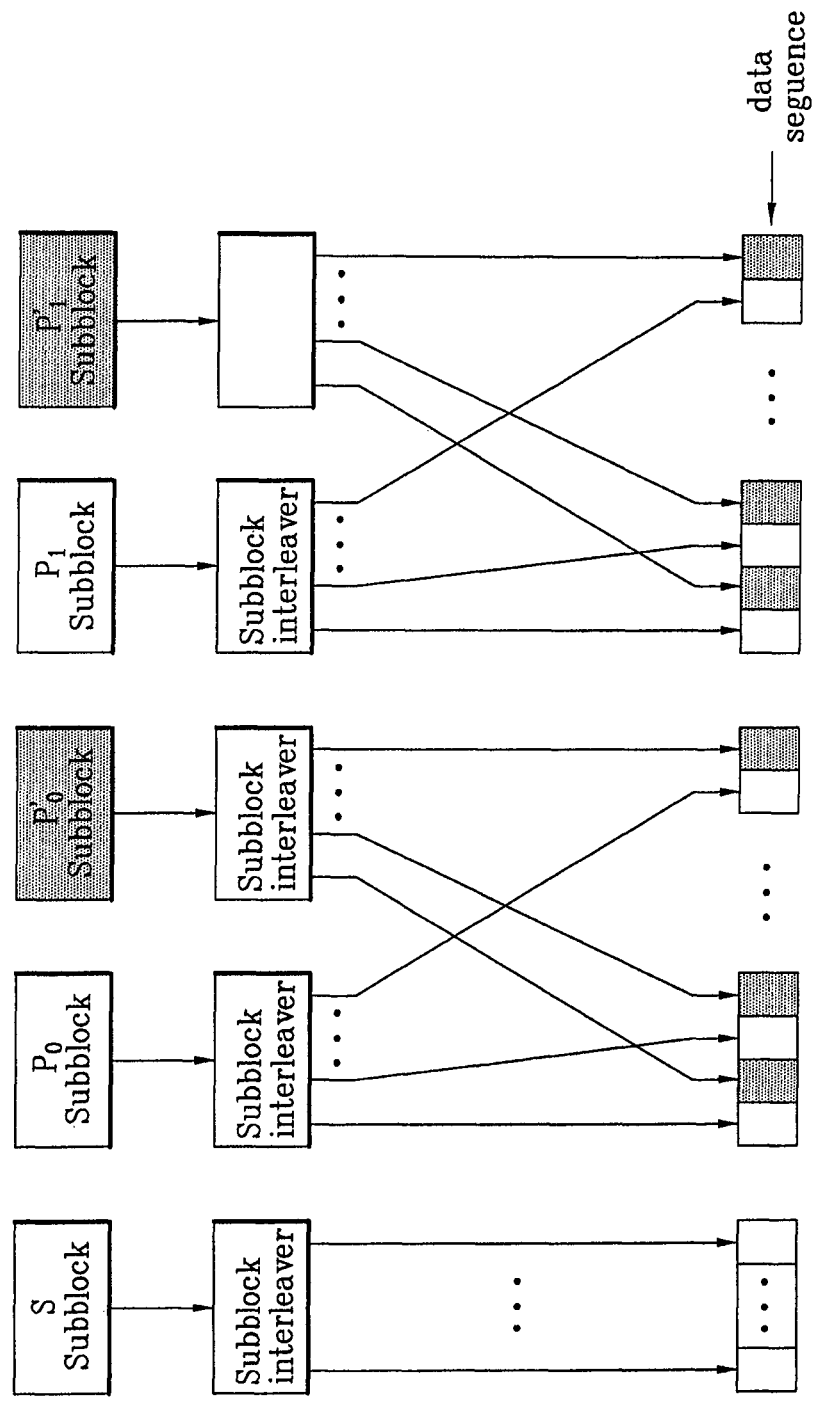
FIG. 1 is a block diagram illustrating a procedure of performing channel interleaving to allow a transmitter of CDMA-2000 system to transmit data to a receiver through F-PDCH.

FIG. 1 is a block diagram illustrating a procedure of performing channel interleaving to allow a transmitter of CDMA-2000 system to transmit data to a receiver through F-PDCH. In FIG. 1, a symbol output from a channel encoder (not shown) is demultiplexed into five subblocks and then input to each subblock interleaver. The input data sequences and the data sequences output from each subblock interleaver are grouped in a symbol unit, whereby a channel interleaved data sequence is finally output.

Figure 2:
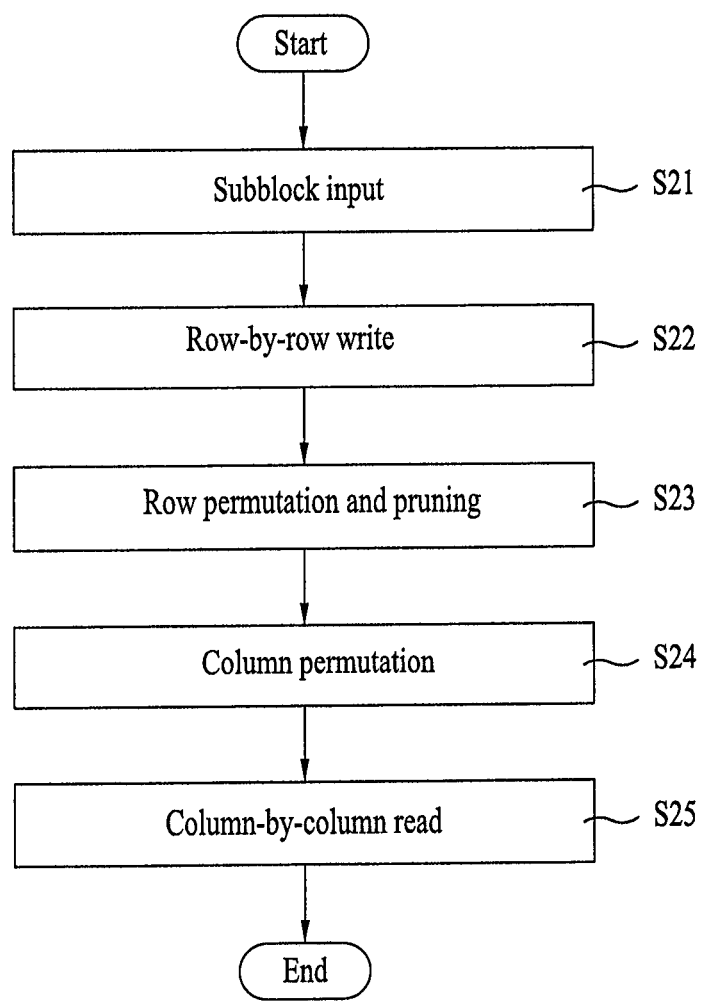
FIG. 2 is a flow chart illustrating an interleaving method according to one embodiment of the present invention.

FIG. 2 is a flow chart illustrating an interleaving method according to one embodiment of the present invention. The embodiment of FIG. 2 is to describe a procedure of performing interleaving in each subblock interleaver of FIG. 1 by using the input subblock.

Referring to FIG. 2, a subblock is input to a specific subblock interleaver [S21]. The subblock can include some or all of a data sequence output from the channel encoder which performs channel encoding such as turbo coding, convolution coding or LDPC (Low Density Parity Check) coding. For example, if channel encoding is performed by turbo coding, a codeword includes an information part, a first parity part, and a second parity part, all or each of which can constitute the subblock. Alternatively, the subblock can be constituted in such a manner that CRC code bits for error detection are added to each part. A size L of the subblocks i.e., a length of a data sequence constituting the subblock is variable. It is assumed that a maximum length of the data sequence is 32. At this time, a relatively small number 32 is selected for convenience of description. Greater sized subblock may actually be used in the system. It is assumed that the size of the subblock input to the subblock interleaver is 26.

The subblock input to the subblock interleaver is sequentially written in a memory for interleaving row by row [S22]. The memory is constituted in the form of a matrix having the number of rows $N_R$ and the number of columns $N_C$. Preferably, the number of columns $N_C$ is $C_{th}$ power of 2 ($N_C=2^C$). In this embodiment, C has a value of 2, and $N_C$ is equal to 4 ($N_C=4$). It is assumed that the number of rows $N_R$ is 8 considering the maximum size $L_{max}$ of the subblock. In this case, it will be apparent that values other than the number of rows $N_R$ and the number of columns $N_C$ can be selected.

Table 2 represents that the subblock having a length L of 26 is input to the subblock interleaver and then written in the matrix of the memory. Dummy bits are written in an address of the memory, where data bits are not written.

TABLE 2

|   | 0     | 1     | 2     | 3     |
|---|-------|-------|-------|-------|
| 0 | 0     | 1     | 2     | 3     |
| 1 | 4     | 5     | 6     | 7     |
| 2 | 8     | 9     | 10    | 11    |
| 3 | 12    | 13    | 14    | 15    |
| 4 | 16    | 17    | 18    | 19    |
| 5 | 20    | 21    | 22    | 23    |
| 6 | 24    | 25    | dummy | dummy |
| 7 | dummy | dummy | dummy | dummy |

In Table 2, the first row includes index of each column, and the first column includes index of each row. The other values mean index of each bit written in the above matrix.

In FIG. 2, after the subblock is written in the above matrix, R-bit BRO operation is performed for an index of each row with respect to R which satisfies $2^{R-1}<N_r\leq 2^R$, so as to perform row permutation, and pruning is performed for a row in which the result of BRO operation performed for an index of each row is greater than or equal to $N_r$ [S23]. In this case, $N_r$ means the number of rows in which data bits are actually written in the above matrix, and can be obtained by the following equation 2.

$$N_r = \left\lceil \frac{L}{N_c} \right\rceil \quad \text{[Equation 2]}$$

In Table 2, since $N_r$ is equal to 7, a value of R becomes 3. Accordingly, a row permutation pattern which is the result obtained by 3-bit BRO operation for an index of each row becomes {0, 4, 2, 6, 1, 5, 3, 7}. Table 3 illustrates the result of row permutation performed in accordance with the obtained row permutation pattern.

TABLE 3

|   | 0 | 1 | 2 | 3 |
|---|---|---|---|---|
| 0 | 0 | 1 | 2 | 3 |
| 4 | 16 | 17 | 18 | 19 |
| 2 | 8 | 9 | 10 | 11 |
| 6 | 24 | 25 | dummy | dummy |
| 1 | 4 | 5 | 6 | 7 |
| 5 | 20 | 21 | 22 | 23 |
| 3 | 12 | 13 | 14 | 15 |
| 7 | Dummy | dummy | dummy | dummy |

In Table 3, pruning is performed for a row in which the result of 3-bit BRO operation performed for an index of each row is $N_r$, i.e., greater than 7 [S23]. The result of pruning is as illustrated in Table 4 below.

TABLE 4

|   | 0 | 1 | 2 | 3 |
|---|---|---|---|---|
| 0 | 0 | 1 | 2 | 3 |
| 4 | 16 | 17 | 18 | 19 |
| 2 | 8 | 9 | 10 | 11 |
| 6 | 24 | 25 | dummy | dummy |
| 1 | 4 | 5 | 6 | 7 |
| 5 | 20 | 21 | 22 | 23 |
| 3 | 12 | 13 | 14 | 15 |

In FIG. 2, after the row permutation and pruning are performed, column permutation is performed using C of column index, i.e., 2-bit BRO operation [S24]. A column permutation pattern which is the result obtained by 2-bit BRO operation for an index of each column becomes {0, 2, 1, 3}. The result of column permutation performed in accordance with the obtained column permutation pattern is illustrated in Table 5 below.

TABLE 5

|   | 0 | 2 | 1 | 3 |
|---|---|---|---|---|
| 0 | 0 | 2 | 1 | 3 |
| 4 | 16 | 18 | 17 | 19 |
| 2 | 8 | 10 | 9 | 11 |
| 6 | 24 | dummy | 25 | dummy |
| 1 | 4 | 6 | 5 | 7 |
| 5 | 20 | 22 | 21 | 23 |
| 3 | 12 | 14 | 13 | 15 |

After the column permutation is performed, the data sequences written in the above matrix are sequentially read column by column and then output [S25]. At this time, pruning is performed for dummy bits. When compared with the result of Table 1, since pruning has been performed for a row, which satisfies a specific condition during the row permutation procedure, it is noted that the number of times of pruning decreases during the procedure of reading data bits from the memory. Accordingly, it is possible to improve system performance and reduce complexity.

In the embodiment of FIG. 2, each of a data sequence is sequentially written in the memory in a row direction during block interleaving, and row permutation, pruning and column permutation are performed. Afterwards, the data sequence is sequentially read from the memory in a column direction and then output. According to another embodiment, it is considered that after data sequence is written in the memory in a column direction and column permutation, pruning and row permutation are performed, the data sequence is sequentially read from the memory in a row direction. In this case, the memory is constituted in such a manner that the number of rows $N_R$ is $R_{th}$ power of 2 ($N_R=2^R$), and the number of columns is $N_C$. Also, R-bit BRO operation is performed for an index of each row with respect to C which satisfies $2^{C-1}<N_c \leq 2^C$, so as to perform row permutation, and pruning is performed for a row in which the result of BRO operation performed for index of each row is greater than or equal to $N_c$. In this case, $N_c$ means the number of columns where data bits are actually written in the memory matrix. After column permutation and pruning are performed, row permutation is performed using R-bit BRO operation for index of each row.

Figure 3:
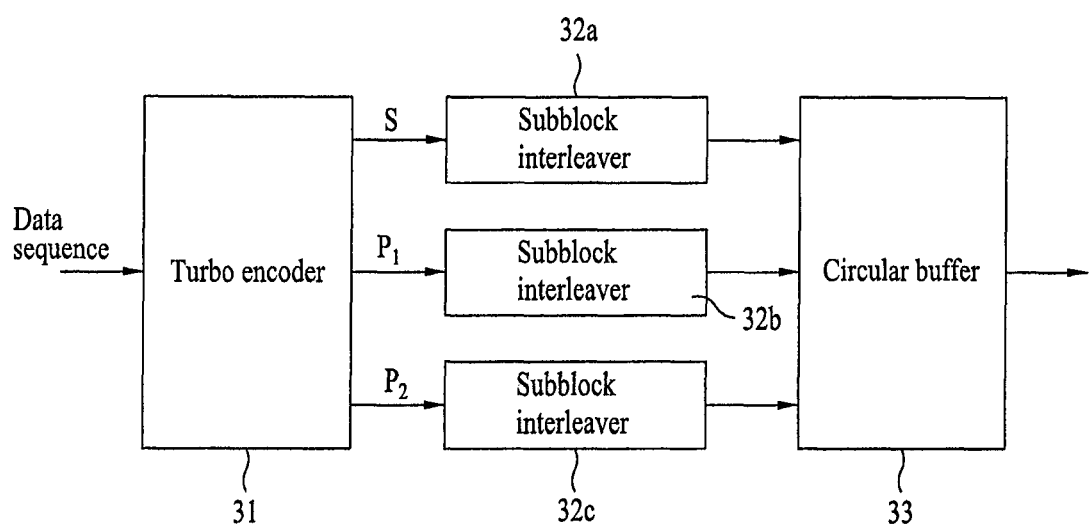
FIG. 3 is a diagram illustrating a data transmission apparatus according to another embodiment of the present invention.

FIG. 3 is a diagram illustrating a method of performing interleaving in accordance with another embodiment of the present invention. In the embodiment of FIG. 3, technical features of the present invention are applied to a transmitter of 3GPP LTE (Long Term Evolution) system. FIG. 3 is a block diagram illustrating a part of the transmitter.

Referring to FIG. 3, a data sequence input to a turbo encoder 31 is encoded by the turbo encoder 31 and divided into three parts, i.e., a systematic bit stream S, a first parity bit stream $P_1$, and a second parity bit stream $P_2$. Each of the bit streams output from the turbo encoder 31 is input to each of subblock interleavers 32a, 32b, and 32c. Each of the subblock interleavers 32a, 32b, and 32c performs interleaving for each of the bit streams in accordance with the embodiment of the present invention, which will be described later. The bit stream output from the subblock interleavers 32a, 32b and 32c is stored in a circular buffer 33 in accordance with a given order. Although the subblock interleavers 32a, 32b and 32c are respectively illustrated in FIG. 3, one subblock interleaver may be provided to sequentially perform interleaving for the respective input bit stream.

Supposing that an interleaving size of a turbo interleaver inside the turbo encoder is $K_{QPP}$, each length $K_s$ of the systematic bit stream, the first parity bit stream and the second parity bit stream output from the turbo encoder 31 becomes $K_{Qpp}+4$. At this time, "4" are tail bits added by the turbo encoder 31. Since a value of $K_{QPP}$ used in the 3GPP LTE system is a multiple of 8, a value of $K_s$ is a multiple of 4. Supposing that the number of columns $N_c$ of the memory matrix of each of the subblock interleavers 32a, 32b and 32c is 4, the number of rows $N_r$ where data are written in the memory matrix becomes $K_s/4$. In view of a general concept, it is preferably set that the size of the data streams input to the subblock interleaver becomes a integer multiple of the number of columns and/or the number of rows of the memory matrix of the subblock interleaver.

Hereinafter, an interleaving procedure performed by the subblock interleaver 32a to which the systematic bit stream is input will be described in more detail. The following description can equally be applied to an interleaving procedure performed by the subblock interleavers 32b and 32c to which the first parity bit stream and the second parity bit stream are respectively input. The procedure illustrated in FIG. 2 can be applied to the interleaving procedure.

Each bit of the systematic bit stream input to the subblock interleaver 32a is sequentially written in the memory matrix of the subblock interleaver 32a in a row direction. After the systematic bit stream is written in the memory matrix, a row permutation pattern is obtained by M-bit BRO operation performed for an index of each row, and row permutation is performed in accordance with the result of the obtained row permutation pattern. In this case, the parameter M can variably be calculated for each length of the input systematic bit stream in accordance with the following algorithm.

```
M=0
while N_r > 2^M
  M=M+1
end while
```

The parameter M can be fixed to a specific value $M_{max}$ considering the maximum value of $K_{QPP}$. For example, the maximum value of $K_{QPP}$ used in the current LTE system is 6144, the maximum length of the systematic bit stream input to the subblock interleaver 32a becomes 6148. When considering that the number of columns of the memory matrix of the subblock interleaver 32a is 4, the number of rows of the memory matrix that can accept data streams having a length of 6148 becomes 1537, and the parameter M, i.e., $M_{max}$ corresponding to the number of rows 1537 becomes 11. In this case, when the parameter M is fixed to 11, pruning is performed during the column permutation procedure if the length of the systematic bit stream input to the subblock interleaver 32a is smaller than 6148. Next, M-bit BRO operation and the row permutation procedure will be described with reference to the following algorithm.

```
i=0
for m=0 to 2^M-1
  B=BRO(m, M)       --M-bits BRO operation
  if B < N_r,        --check whether B exceeds N_r, and if so, pruning
    π_r(i)=B         -- row permutation
    i=i+1
  end if
end for
```

The subblock interleaver 32a performs column permutation after performing row permutation. Since the size of the column of the memory matrix is 4, a column permutation pattern $\pi_c(i)$ for index (i) of each column can be expressed as follows.

$$\pi_c(i)=\{0,1,2,3\}, i=0,1,2,3$$

The column permutation is performed by changing the order of columns in accordance with the column permutation pattern. Although the column permutation has been performed as above after the row permutation is performed, the order can be changed. Namely, the same result can be obtained even though the row permutation is performed after the column permutation is performed.

After the column permutation is performed, the subblock interleaver 32a sequentially reads the data stream written in the above matrix column by column and then outputs each bit of the data stream.

The whole procedure of interleaving performed by the subblock interleaver 32a can be expressed by the following algorithm.

```
for i=0 to K_s-1
  P_c=π_c(floor(i/N_r))    --Column permutation
  P_r=π_r(mod(i, N_r))      --Row permutation
  π(i)=4*P_r+P_c             --Column by column reading
end for
```

In the above algorithm, π(i) becomes a subblock interleaving pattern for an index of each bit of the systematic bit stream input to the subblock interleaver 32a.

The aforementioned interleaving procedure can be applied to the first parity bit stream and the second parity bit stream. However, an offset value δ can be used when interleaving for the second parity bit stream is performed.

After interleaving ends, the systematic bit stream output from the subblock interleaver 32a is first stored in the circular buffer 33, and then interlaced versions of the first parity bit stream and the second parity bit stream output from the subblock interleaver 32b and the subblock interleaver 32c are stored therein.

The bit streams stored in the circular buffer 33 are transmitted to a receiver in accordance with a hybrid auto repeat request (HARQ) scheme. In other words, if NACK is received in response to a packet output from the circular buffer 33 and transmitted to the receiver, the transmitter retransmits another packet of next redundancy version (RV) to the receiver. Supposing that the number of times of maximum retransmission according to the HARQ scheme is 4, packets of four RVs are stored in the circular buffer 33. At this time, each RV represents a starting point of its corresponding packet. Each of the packets is located at constant intervals in the circular buffer 33.

In order to improve turbo encoding performance at a high code rate, puncturing can be performed for the systematic bit stream during initial packet transmission according to the HARQ scheme. Puncturing for the systematic bit stream can be performed by skipping initial σ bits in the circular buffer 33 from transmission. For example, the parameter σ can be calculated by the following equation.

$$\sigma = \text{floor}(K_s/0.05) \quad \text{[Equation 3]}$$

A start point $S_i$, i.e., each RV, of each packet in the circular buffer 33 can be calculated by the following equation 4.

$$S_i = i*3*N_r + \sigma, i=0,1,2,3 \quad \text{[Equation 4]}$$

Since the subblock interleaver according to the embodiment of FIG. 3 does not add and remove dummy bits for pruning when performing interleaving, it can easily be applied to a concept of a virtual circular buffer (VCB).

The aforementioned embodiments are achieved by combination of structural elements and features of the present invention in a predetermined type. Each of the structural elements or features should be considered selectively unless specified separately. Each of the structural elements or features may be carried out without being combined with other structural elements or features. Also, some structural elements and/or features may be combined with one another to constitute the embodiments of the present invention. The order of operations described in the embodiments of the present invention may be changed. Some structural elements or features of one embodiment may be included in another embodiment, or may be replaced with corresponding structural elements or features of another embodiment. Moreover, it will be apparent that some claims referring to specific claims may be combined with another claims referring to the other claims other than the specific claims to constitute the embodiment or add new claims by means of amendment after the application is filed.

The embodiments according to the present invention may be implemented by various means, for example, hardware, firmware, software, or their combination. If the embodiment according to the present invention is implemented by hardware, the embodiment of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

If the embodiment according to the present invention is implemented by firmware or software, the method of transmitting and receiving data in the wireless communication system according to the embodiment of the present invention may be implemented by a type of a module, a procedure, or a function, which performs functions or operations described as above. A software code may be stored in a memory unit and then may be driven by a processor. The memory unit may be located inside or outside the processor to transmit and receive data to and from the processor through various means which are well known.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

INDUSTRIAL APPLICABILITY

The present invention can be used in all fields where interleaving is needed, in addition to a wireless communication system such as a mobile communication system and a wireless Internet system.

The invention claimed is:

1. A method of performing interleaving for an input data stream, the method comprising:
writing respective bits of the input data stream in a row direction of a memory matrix in accordance with the input order;
performing row permutation for index of each row of the memory matrix using an R-bit bit reverse ordering (BRO) operation, wherein R is an integer;
performing pruning for a row which satisfies a given condition;
performing column permutation using a BRO operation for index of each column of the memory matrix; and
reading to output each bit in a column direction of the memory matrix where the column permutation has been performed.

2. The method of claim 1, wherein the integer R is determined in accordance with the number of rows $N_r$ in which data bits are written in the memory matrix.

3. The method of claim 2, wherein the integer R is a value which satisfies $2^{R-1} < N_r \leq 2^R$.

4. The method of claim 3, wherein the given condition relates to whether the result of the R-bit BRO operation for index of each row is greater than or equal to $N_r$.

5. The method of claim 3, wherein the number of columns $N_c$ of the memory matrix is a value which is $C_{th}$ power of 2 such that $N_c = 2^C$.

6. The method of claim 5, wherein a C-bit BRO operation is performed for index of each column when the column permutation is performed.

7. The method of claim 1, wherein reading to output each bit in a column direction of the memory matrix includes performing pruning for an address where data bits are not written or dummy bits are written.

8. The method of claim 5, wherein the input data stream has a length corresponding to an integer multiple of the number of rows $N_r$ of the memory matrix.

9. The method of claim 1, wherein the integer R is fixed to a value corresponding to a maximum length of the input data streams.

10. The method of claim 1, wherein the input data stream is any one of a systematic bit stream, a first parity bit stream, and a second parity bit stream, which are output from a turbo encoder.

11. A data transmission apparatus comprising:
a channel encoder performing channel encoding for an input data stream;
an interleaver performing interleaving for at least part of a codeword output from the channel encoder by using row permutation and column permutation using bit reverse ordering (BRO) operation; and
a buffer storing a data stream output from the interleaver,
wherein, when $N_r$ is the number of rows in which data bits are written in a memory matrix of the interleaver, the row permutation is performed for an integer R, which satisfies $2^{R-1} < N_r \leq 2^R$, using an R-bit BRO operation for an index of each row of the memory matrix.

12. The data transmission apparatus of claim 11, wherein the number of columns $N_c$ of the memory matrix is a value which is $C_{th}$ power of 2 such that $N_c = 2^C$.

13. The data transmission apparatus of claim 12, wherein a C-bit BRO operation is performed for index of each column when the column permutation is performed.

14. The data transmission apparatus of claim 11, wherein the at least part of the codeword is any one of a systematic bit stream, a first parity bit stream, and a second parity bit stream, which are output from the channel encoder.

* * * * *